United States Patent
Mugnier

(10) Patent No.: US 10,107,033 B2
(45) Date of Patent: Oct. 23, 2018

(54) OPERATING CONTROL METHOD OF A MOTORIZED DRIVING DEVICE OF A CLOSURE OR SUN PROTECTION HOME AUTOMATION INSTALLATION, AND RELATED DEVICE

(71) Applicant: SOMFY SAS, Cluses (FR)

(72) Inventor: David Mugnier, Mont-Saxonnex (FR)

(73) Assignee: SOMFY SAS, Cluses (FR)

(*) Notice: Subject to any disclaimer, the term of this patent is extended or adjusted under 35 U.S.C. 154(b) by 0 days.

(21) Appl. No.: 15/328,832

(22) PCT Filed: Jul. 23, 2015

(86) PCT No.: PCT/EP2015/066938
§ 371 (c)(1),
(2) Date: Jan. 24, 2017

(87) PCT Pub. No.: WO2016/012566
PCT Pub. Date: Jan. 28, 2016

(65) Prior Publication Data
US 2017/0218699 A1 Aug. 3, 2017

(30) Foreign Application Priority Data
Jul. 25, 2014 (FR) ..................... 14 57199

(51) Int. Cl.
*H02P 1/04* (2006.01)
*E06B 9/72* (2006.01)
(Continued)

(52) U.S. Cl.
CPC ................ *E06B 9/72* (2013.01); *E06B 9/15* (2013.01); *G01R 19/0046* (2013.01); *E06B 2009/6818* (2013.01)

(58) Field of Classification Search
CPC . E05F 15/00; E05F 15/40; E05F 15/41; E05F 15/60; E05F 15/603; H02H 7/00;
(Continued)

(56) References Cited

U.S. PATENT DOCUMENTS 4,386,398 A * 5/1983 Matsuoka ............ H02H 7/0851
318/266
5,482,103 A * 1/1996 Burgess ................. A62C 2/242
160/190

(Continued)

FOREIGN PATENT DOCUMENTS

EP  2 725 182 A1  4/2014
JP  2005-42485 A1  2/2005

OTHER PUBLICATIONS

International Search Report, dated Oct. 13, 2015, from corresponding PCT Application.
(Continued)

*Primary Examiner* — Rina Duda
(74) *Attorney, Agent, or Firm* — Young & Thompson

(57) ABSTRACT

A method for operationally controlling a motor-driven device for driving a home automated closure or sun-shading apparatus includes at least the following steps: —measuring (E21), via a measuring device, a first value of the strength of an electrical current passing through an electric motor; —determining (E24) a difference in strength relative to the first measured strength value after a period of time starting from the moment that the first strength value is measured has elapsed; —selecting (E25) one of the first threshold strength values on the basis of the elapsed time period; —comparing (E26) the difference in strength determined relative to the selected threshold strength value; and —determining (E27) the presence or absence of an obstacle or end of travel on the basis of the result of the comparison step (E26).

12 Claims, 5 Drawing Sheets

(51) Int. Cl.
*E06B 9/15* (2006.01)
*G01R 19/00* (2006.01)
*E06B 9/68* (2006.01)

(58) Field of Classification Search
CPC ...... H02H 7/08; H02H 7/0851; H02H 7/0853; H02H 7/0854; E05Y 2900/00; E05Y 2900/106; E05Y 2900/132; E05Y 2900/146
USPC .................................. 318/443, 445, 466, 468
See application file for complete search history.

(56) References Cited

U.S. PATENT DOCUMENTS

| | | | | |
|---|---|---|---|---|
| 5,896,907 A * | 4/1999 | Dever | .................... | A62C 2/241 |
| | | | | 160/6 |
| 6,014,307 A * | 1/2000 | Crimmins | ................ | E06B 9/68 |
| | | | | 361/170 |
| 6,055,885 A * | 5/2000 | Shea | ........................ | E06B 9/74 |
| | | | | 160/310 |
| 6,123,134 A * | 9/2000 | Thomas | ................... | A62C 2/24 |
| | | | | 160/296 |
| 6,484,784 B1 * | 11/2002 | Weik, III | ................ | E05F 1/006 |
| | | | | 160/7 |
| 6,737,823 B2 * | 5/2004 | Reed | ........................ | E06B 9/68 |
| | | | | 318/280 |
| 6,967,451 B2 * | 11/2005 | Miyauchi | ............. | H02H 7/0851 |
| | | | | 318/280 |
| 7,358,480 B2 * | 4/2008 | Mullet | .................. | E05F 15/603 |
| | | | | 250/231.13 |
| 7,382,063 B2 * | 6/2008 | Mullet | .................... | E05F 15/00 |
| | | | | 307/64 |
| 7,592,767 B2 * | 9/2009 | Rodriguez | ............ | E05F 15/668 |
| | | | | 160/292 |
| 2002/0074960 A1 * | 6/2002 | Schlecht | ............ | G05B 19/4062 |
| | | | | 318/445 |
| 2008/0184622 A1 * | 8/2008 | Mullet | .................... | E05F 15/00 |
| | | | | 49/26 |
| 2008/0260363 A1 * | 10/2008 | Carmen | .................... | E06B 9/68 |
| | | | | 388/811 |

OTHER PUBLICATIONS

French Search Report, dated Mar. 13, 2015, from corresponding French Application.

* cited by examiner

OPERATING CONTROL METHOD OF A MOTORIZED DRIVING DEVICE OF A CLOSURE OR SUN PROTECTION HOME AUTOMATION INSTALLATION, AND RELATED DEVICE

BACKGROUND OF THE INVENTION

Field of the Invention

The present invention relates to an operating control method of a motorized driving device of a closure or sun protection home automation installation.

The present invention also relates to a motorized driving device of a closure or sun protection home automation installation suitable for carrying out this control method.

Description of the Related Art

In general, the present invention relates to the field of concealment devices comprising a motorized driving device setting a screen in motion between at least one first position and one second position.

A motorized driving device comprises an electromechanical actuator for a movable element for closing, concealing or providing sun protection such as a shutter, door, gate, blind, or any other equivalent material, hereinafter referred to as a screen.

Document JP 2005 042 485 A is already known, and describes a motorized driving device of a closure or sun protection home automation installation. The closure or sun protection home automation installation comprises a concealing device. The concealing device comprises a screen, in particular a rolling shutter, and a winding tube. The motorized driving device comprises an electromechanical actuator making it possible to wind and unwind the screen on the winding tube, between a wound position and an unwound position. The electromechanical actuator comprises a direct current electric motor. The direct current electric motor comprises an output shaft connected to the winding tube of the concealing device. The direct current electric motor also comprises an electronic control unit. The electronic control unit comprises a device for measuring a physical parameter, in particular an intensity value of the electrical current passing through the direct current electric motor, a memory storing a plurality of intensity threshold values and an obstacle detection device during the winding of the screen or during the unwinding of the screen.

The movement travel of the screen includes several portions during the winding of the screen or during the unwinding of the screen. Additionally, each portion of the movement travel of the screen is associated with an intensity threshold value, so as to adapt the obstacle detection sensitivity to each portion of the movement travel of the screen. The electronic control unit measures different intensity values passing through the direct current electric motor through the measuring device during the movement of the screen by the motorized driving device.

Following the sampling of the measured intensity values, the latter are converted by an analog/digital converter, then stored in a memory of the electronic control unit, so as to form a profile. The measured intensity values are representative of the torque supplied by the direct current electric motor of the electromechanical actuator.

The electronic control unit comprises means for updating obtained intensity threshold values by adding a margin to a reference intensity value, the reference intensity value corresponding to an intensity value recently measured by the measuring device, so as to take into consideration changes in season and aging of the home automation installation. The reference intensity value corresponds to the measured intensity value having the highest value from among the most recent measured intensity values, or an intensity value larger than the highest value from among the most recent measured intensity values, or an intermediate intensity value among the most recent measured intensity values, or an intensity value corresponding to the average of the most recent measured intensity values. The margin added to the reference intensity value making it possible to define an intensity threshold value may be different based on the movement direction of the screen of the concealing device, in particular, during the winding of the screen or during the unwinding of the screen.

The electronic control unit compares the measured intensity values relative to one of the updated intensity threshold values and determines the presence or absence of an obstacle.

However, this motorized driving device has the drawback of detecting the upper and lower end of travel stops during the movement of the screen of the concealing device using additional switches relative to the obstacle detection device implemented via software making it possible to detect an obstacle between the upper and lower end of travel stops by the device measuring current passing through the direct current electric motor. Consequently, such a motorized driving device including, on the one hand, a device for detecting end of travel stops, and on the other hand, an obstacle detection device creates high implementation costs.

Furthermore, this motorized driving device comprising an obstacle detection device, where the intensity threshold values are determined by adding a margin based on intensity values previously measured, creates difficulties to guarantee the update of the intensity threshold values based on the usage frequency of the motorized driving device, operating variations related to climate conditions in the environment of the home automation installation. Furthermore, this motorized driving device requires a learning phase, during commissioning of the home automation installation, to determine an evolution profile of the intensity passing through the electric motor during the unwinding of the screen and during the winding of the screen. Consequently, the obstacle detection device may create untimely stops of the motorized driving device in the case where the intensity threshold values are too low, or fail to detect obstacles in the case where the intensity threshold values are too high.

BRIEF SUMMARY OF THE INVENTION

The present invention aims to resolve the aforementioned drawbacks and propose an operating control method of a motorized driving device of a closure or sun protection home automation installation, as well as an associated motorized driving device, making it possible to determine the ends of travel of movement of the screen, as well as the presence or absence of obstacle, using a same detection device implemented via software, while minimizing the implementation costs of the motorized driving device.

To that end and according to a first aspect, the present invention relates to an operating control method of a motorized driving device of a closure or sun protection home automation installation, the closure or sun protection home automation installation comprising a concealing device,
the concealing device comprising at least:

a screen, and
a winding tube,
the motorized driving device comprising at least:
an electromechanical actuator making it possible to wind and unwind the screen on the winding tube, between a wound position and an unwound position,
the electromechanical actuator comprising at least:
an electric motor, the electric motor comprising an output shaft connected to the winding tube of the concealing device, and
an electronic control unit,
the electronic control unit comprising at least:
a device for measuring an intensity value of an electric current passing through the electric motor,
a memory storing a plurality of intensity threshold values, and
a device for detecting obstacles and ends of travel during winding of the screen and during unwinding of the screen,
said method comprises at least:
a step for measuring a first intensity value of the electric current passing through the electric motor via the measuring device.
According to the invention, said method comprises at least:
a step for determining a difference in intensity relative to the first measured intensity value, after a period of time has elapsed beginning from the moment at which the first intensity value is measured,
a step for selecting one of the intensity threshold values based on the elapsed period of time,
a step for comparing the determined difference in intensity to the selected intensity threshold value, and
a step for determining the presence or absence of an obstacle or an end of travel by the detection device based on the result of the comparison step.

Thus, the control method makes it possible to determine whether ends of travel of movement of the screen have been reached, as well as whether obstacle is present or absent by monitoring differences in intensity relative to a first intensity value passing through the electric motor.

In this way, the control method makes it possible to determine the presence or absence of an obstacle or an end of travel dynamically, by comparing differences in intensity determined from a first intensity value passing through the electric motor relative to an intensity threshold value selected based on the period of time elapsed between the moment at which the first intensity value is measured and the moment at which an intensity difference is determined.

Consequently, the control method makes it possible to guarantee the protection of the motorized driving device and the home automation installation, while limiting untimely movement stops of the screen of the concealing device.

The implementation of such a control method, in which the determination of the presence or absence of an obstacle or an end of travel via software by the detection device makes it possible to minimize the implementation costs of the motorized driving device.

Furthermore, the operating control method of the motorized driving device makes it possible to do without a learning phase during commissioning of the home automation installation, intended to determine an evolution profile of the intensity passing through the electric motor during the unwinding of the screen and during the winding of the screen.

According to one preferred feature of the invention, the method comprises one or more additional steps for measuring another intensity value passing through the electric motor via the measuring device, following the implementation of the step for measuring the first intensity value passing through the electric motor; a step for determining an evolution of the intensity value passing through the electric motor through steps for measuring an intensity value passing through the electric motor. The method implements the step for determining a difference in intensity relative to the first measured intensity value when the step for determining an evolution of the intensity value passing through the electric motor determines an increase in the intensity value passing through the electric motor.

Practically, in the case where it is determined that the intensity value passing through the electric motor has decreased, during the step for determining an evolution of the intensity value passing through the electric motor, the control method once again carries out the steps for measuring the first intensity value passing through the electric motor.

According to another preferred feature of the invention, following the step for determining a difference in intensity relative to the first measured intensity value, the method comprises a step for determining an evolution of the difference in intensity relative to the first measured intensity value.

Practically, the step for determining a difference in intensity relative to the first measured intensity value is implemented periodically, as long as the result of the step for determining an evolution of the difference in intensity corresponds to an increase in the intensity value passing through the electric motor.

Advantageously, the step for determining a difference in intensity relative to the first measured intensity value is implemented periodically, as long as the result of the step for determining the presence or absence of an obstacle or an end of travel is different from a detected obstacle or detected end of travel.

Preferably, the step for determining a difference in intensity relative to the first measured intensity value is carried out periodically during a predetermined period of time beginning from the moment at which the first intensity value is measured.

Practically, the step for measuring the first intensity value passing through the electric motor is carried out after a predetermined period of time has elapsed beginning from the moment when the startup of the electric motor is commanded.

According to another preferred feature of the invention, the method also comprises a step for determining the rotation direction of the output shaft of the electric motor, a step for determining the position of the screen of the concealing device and a step for determining several portions of the movement travel of the screen during the winding of the screen and during the unwinding of the screen. At least the steps for determining a difference in intensity, selecting one of the intensity threshold values, comparing the determined difference in intensity to the selected intensity threshold value and determining the presence or absence of an obstacle or an end of travel are carried out during at least one portion of the movement travel of the screen, during the winding of the screen or during the unwinding of the screen.

Practically, at least said steps for determining a difference in intensity, selecting one of the intensity threshold values, comparing the determined difference in intensity to the selected intensity threshold value and determining the presence or absence of an obstacle or an end of travel are carried out during a startup portion of the movement travel of the screen, during the winding of the screen or during the unwinding of the screen, after an end of travel has been reached.

According to a second aspect, the present invention relates to a motorized driving device of a closure or sun protection home automation installation, comprising an electronic control unit configured to carry out the control method according to the invention.

This motorized driving device has features and advantages similar to those previously described relative to the control method according to the invention.

Preferably, the electric motor of the electromechanical actuator is of the brushless type with electronic switching.

BRIEF DESCRIPTION OF THE DRAWINGS

Other particularities and advantages of the invention will also appear in the description below.

In the appended drawings, provided as non-limiting examples.

DETAILED DESCRIPTION OF THE PREFERRED EMBODIMENTS

Figure 1:
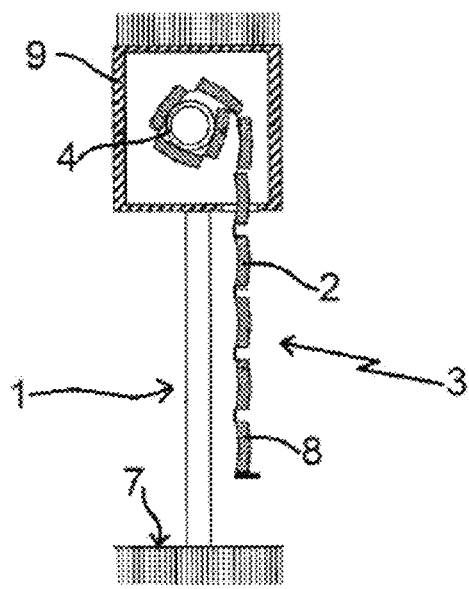
FIG. 1 is a sectional diagrammatic view of a home automation installation according to one embodiment of the invention.
Figure 2:
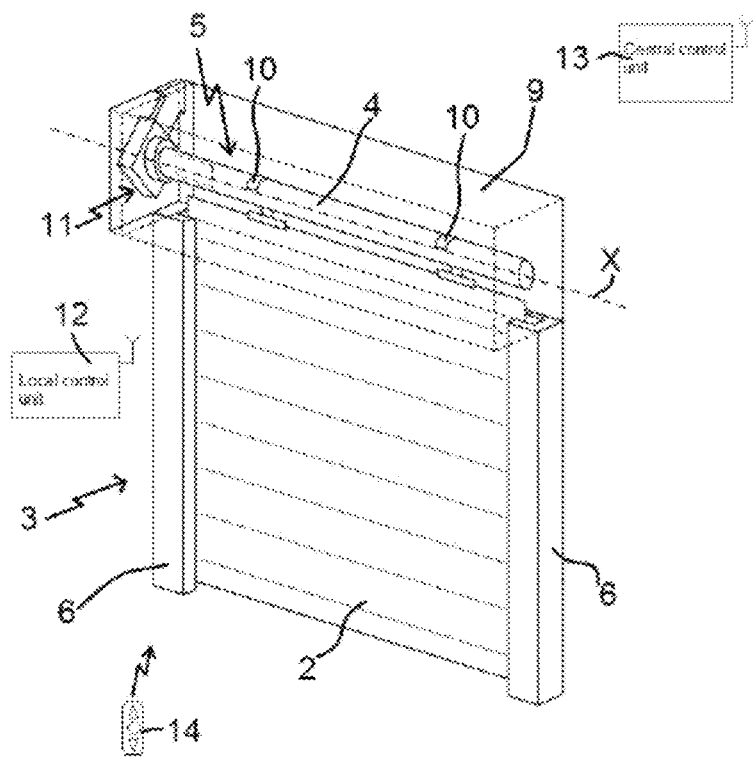
FIG. 2 is a diagrammatic perspective view of the home automation installation illustrated in FIG. 1.

In reference to FIGS. 1 and 2, we will first describe a home automation installation according to the invention and installed in a building comprising an opening 1, window or door, equipped with a screen 2 belonging to a concealing device 3, in particular a motorized rolling shutter.

The concealing device 3 can be a rolling shutter, a canvas blind or blind with orientable slats, or a rolling gate. In practice, the present invention applies to all types of concealing devices.

A rolling shutter according to one embodiment of the invention will be described in reference to FIGS. 1 and 2.

The screen 2 of the concealing device 3 is wound on a winding tube 4 driven by a motorized driving device 5 and movable between a wound position, in particular an upper position, and an unwound position, in particular a lower position.

The motorized driving device 5 comprises an electromechanical actuator 11, in particular of the tubular type, making it possible to set the winding tube 4 in rotation so as to unwind or wind the screen 2 of the concealing device 3.

The concealing device 3 comprises the winding tube 4 for winding the screen 2, where, in the mounted state, the electromechanical actuator 11 is inserted into the winding tube 4.

The moving screen 2 of the concealing device 3 is a closing, concealing and/or sun protection screen, winding on the winding tube 4, the inner diameter of which is substantially equivalent to the outer diameter of an electromechanical actuator 11, such that the electromechanical actuator 11 can be inserted into the winding tube 4 during the assembly of the concealing device 3.

In a known manner, a rolling shutter 3 comprises an apron comprising horizontal slats articulated on one another, forming the screen 2 of the rolling shutter 3, and guided by two lateral guideways 6. These slats are joined when the apron 2 of the rolling shutter 3 reaches its unwound lower position.

In the case of a rolling shutter, the wound upper position corresponds to the bearing of a final L-shaped end slat 8 of the apron 2 of the rolling shutter 3 against an edge of a box 9 of the rolling shutter 3, and the unwound lower position corresponds to the bearing of the final end slat 8 of the apron 2 of the rolling shutter 3 against a threshold 7 of the opening 1.

The first slat of the rolling shutter 3, opposite the end slat, is connected to the winding tube 4 using at least one articulation 10.

The winding tube 4 is positioned inside the box 9 of the rolling shutter 3. The apron 2 of the rolling shutter 3 winds and unwinds around the rolling tube 4 and is housed at least partially inside the box 9.

The motorized driving device 5 is controlled by a control unit. The control unit may for example be a local control unit 12, where the local control unit 12 can be connected through a wired or wireless connection with a central control unit 13. The central control unit 13 drives the local control unit 12, as well as other similar local control units distributed throughout the building.

The central control unit 13 can be in communication with a weather station located outside the building, in particular including one or more sensors that can be configured for example to determine a temperature, brightness, or wind speed.

A remote control 14, which can be a type of local control unit, and provided with a control keypad, which comprises selection and display means, further allows a user to intervene on the electromechanical actuator 11 and/or the central control unit 13.

The motorized driving device 5 is preferably configured to carry out the unwinding or winding commands of the screen 2 of the concealing device 3, which may in particular be transmitted by the remote control 14.

The electromechanical actuator 11 comprises an electric motor 16. The electric motor 16 comprises a rotor and a stator positioned coaxially around an axis of rotation X.

Control means for controlling the electromechanical actuator 11, making it possible to move the screen 2 of the concealing device 3, are made up of at least one electronic control unit 15. This electronic control unit 15 is able to operate the electric motor 16 of the electromechanical actuator 11, and in particular to allow the supply of electricity for the electric motor 16. Thus, the electronic control unit 15 in particular controls the electric motor 16, so as to open or close the screen 2, as previously described.

The electronic control unit 15 also comprises an order receiving module, in particular for radios orders sent by an order transmitter such as the remote control 14 intended to control the electromechanical actuator 11. The order receiving module can also allow the reception of orders sent by wired means.

Figure 3:
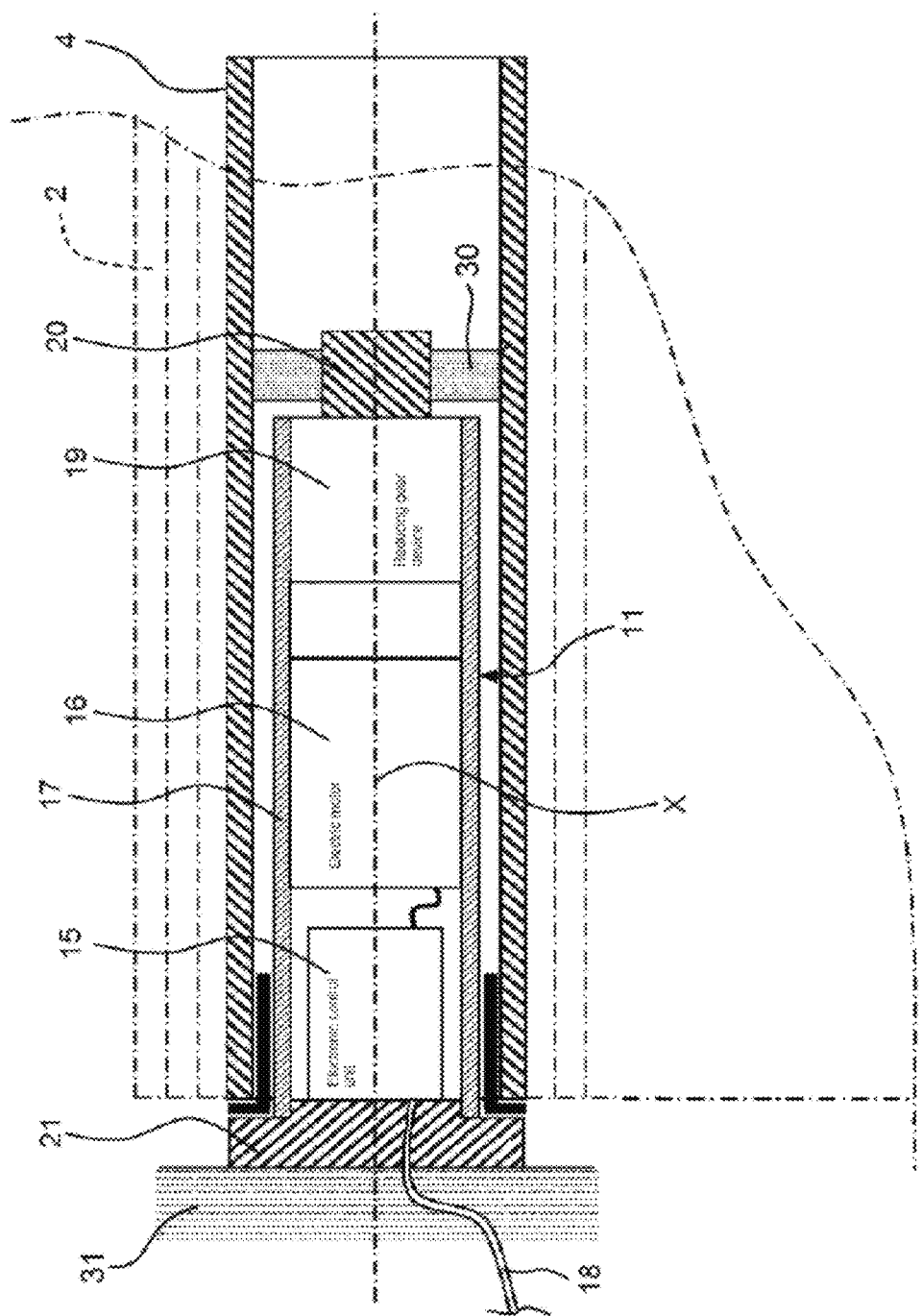
FIG. 3 is a partial diagrammatic sectional view of the home automation installation illustrated in FIGS. 1 and 2, showing an electromechanical actuator.

Here, and as illustrated in FIG. 3, the electronic control unit 15 is positioned inside a casing 17 of the electromechanical actuator 11.

The control means of the electromechanical actuator 11 comprise hardware and/or software means. As one non-limiting example, the hardware means may comprise at least one microcontroller.

The electromechanical actuator 11 belonging to the home automation installation of FIGS. 1 and 2 will now be described in reference to FIGS. 3 and 4.

The electromechanical actuator 11 is supplied with electricity by an electricity grid of the sector, or using a battery, which can for example be recharged by a photovoltaic panel. The electromechanical actuator 11 makes it possible to move the screen 2 of the concealing device 3.

Here, the electromechanical actuator 11 comprises a power cable 18 making it possible to supply electricity from the electricity grid of the sector.

In another embodiment that is not shown, the electromechanical actuator 11 is designed to be placed in a U-shaped profiled rail.

The casing 17 of the electromechanical actuator 11 is preferably cylindrical. In one embodiment, the casing 17 can be made from a metal material. The material of the casing of the electromechanical actuator is in no way limiting and may be different, and in particular made from plastic.

Here, the electric motor 16 is of the brushless DC type with electronic switching, called "BLDC" (BrushLess Direct Current), or said to be synchronous with permanent magnets.

The rotor of the electric motor 16 comprises a rotor body provided with magnetic elements surrounded by the stator. Here, the magnetic elements are permanent magnets.

The stator of the electric motor 16 is formed by a stator core comprising polar elements distributed on the periphery of the stator. The polar elements are also called teeth.

Figure 4:
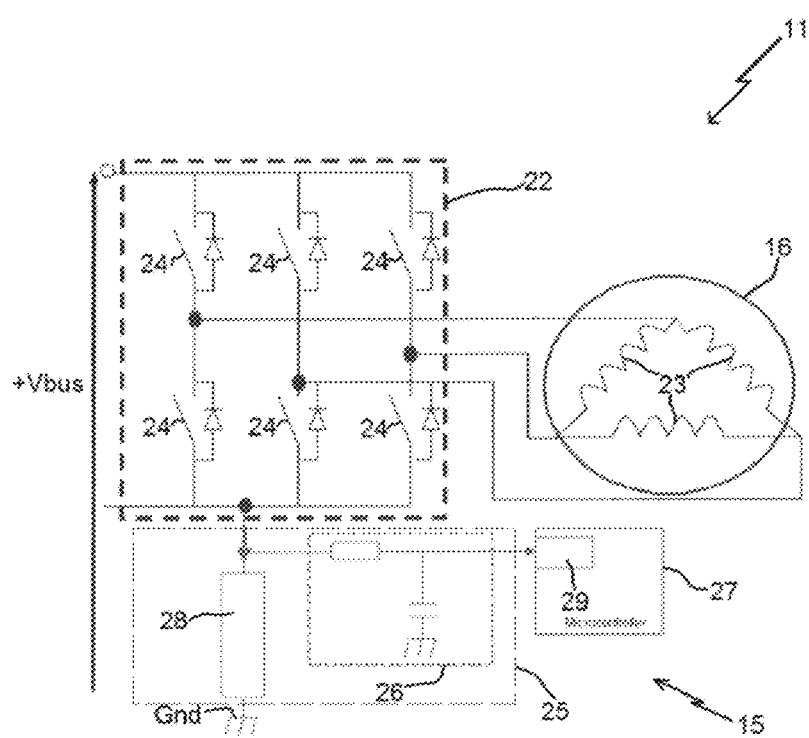
FIG. 4 is an electrical diagram of the electromechanical actuator, as illustrated in FIG. 3, comprising an electric motor and an electronic control unit.

The stator of the electric motor 16 comprises windings 23, in the case at hand three, electrically connected to one another, as illustrated in FIG. 4.

Preferably, the windings 23 are positioned around the polar elements of the stator. More specifically, each polar element is surrounded by a winding 23 specific to it. The windings 23 are connected to one another such that when a current flows through them, they produce a rotating electromagnetic field that rotates the rotor.

The electromechanical actuator 11 also comprises a reducing gear device 19 and an output shaft 20. Advantageously, the electric motor 16 and the reducing gear device 19 are positioned inside the casing 17 of the electromechanical actuator 11.

The output shaft 20 of the electromechanical actuator 11 is positioned inside the winding tube 4, and at least partially outside the casing 17 of the electromechanical actuator 11.

The output shaft 20 of the electromechanical actuator 11 is coupled by a connecting means 30 to the winding tube 4, in particular using a wheel-shaped connecting means.

The electromechanical actuator 11 also comprises a sealing element 21 for one end of the casing 17.

Here, the casing 17 of the electromechanical actuator 11 is fastened to a support 31, in particular a flange, of the box 9 of the concealing device 3 using the sealing element 21 forming a torque pin, in particular a closing off and torque-reacting head. In such a case where the sealing element 21 forms a torque pin, the sealing element 21 is also called a fixed point of the electromechanical actuator 11.

The electronic control unit 15 of the electromechanical actuator 11 comprises a circuit, not shown, for rectifying the alternating voltage of the power supply grid and a power supply module 22. The power supply module 22 is thus electrically connected to a direct voltage source +Vbus. The value of the direct voltage +Vbus is defined relative to a reference voltage Gnd.

The power supply module 22 supplies electricity, sequentially, to the windings 23, so as to produce the rotary electromagnetic field causing the rotation of the rotor of the electric motor 16.

The power supply module 22 comprises switches 24 making it possible to supply electricity sequentially to the windings 23.

Here, the switches 24 of the power supply module 22 are transistors of the MOSFET type (Metal Oxide Semiconductor Field Effect Transistor), and the are six of them. The type and number of switches of the power supply module are in no way limiting. In particular, the switches 24 of the power supply module 22 can be transistors of the IGBT type (Insulated Gate Bipolar Transistor).

The electronic control unit 15 of the electromechanical actuator 11 comprises a device 28 for measuring an intensity value I of an electric current passing through the electric motor 16. Within the meaning of the present invention, the intensity passing through the electric motor 16 is the intensity of an electric current passing through this electric motor 16 during operation. The intensity passing through the electric motor 16 is obtained using a positive rectified signal taking into consideration the current of each of the windings 23 of the electric motor 16.

The acquisition of the intensity value I passing through the electric motor 16 via the measuring device 28 makes it possible to obtain a signal representative of the torque generated by the electric motor 16 of the electromechanical actuator 11.

Here, the device 28 for measuring the intensity value I is implemented using a resistance, called "shunt", electrically connected to the power supply module 22 and the reference voltage Gnd.

The measuring device 28 is an integral part of a signal generator 25. This signal generator 25 also comprises an analog filter 26, in particular a low-pass circuit RC, the circuit RC being made up of a resistance and a capacitance.

The signal generator 25 makes it possible to deliver a signal representative of the power supply supplied to the electric motor 16, in particular the intensity I passing through the electric motor 16, at an input of a microcontroller 27. The input of the microcontroller 27 comprises an analog/digital converter 29.

The signal of the intensity value I acquired by the measuring device 28 is also processed digitally by at least one digital filter, which may for example be a low-pass filter, implemented by the microcontroller 27.

The electronic control unit 15 of the electromechanical actuator 11 comprises a memory storing a plurality of intensity threshold values S. Here, the memory storing a plurality of intensity threshold values S is made up by a memory of the microcontroller 27, in particular a memory of the EEPROM (Electrically Erasable Programmable Read Only Memory) type.

The electronic control unit 15 of the electromechanical actuator 11 comprises a device for detecting obstacles and ends of travel during winding of the screen 2 and during unwinding of said screen 2.

The device for detecting obstacles and ends of travel during winding and unwinding of the screen 2 is implemented using the microcontroller 27, and in particular using an algorithm implemented by this microcontroller.

Figure 5:
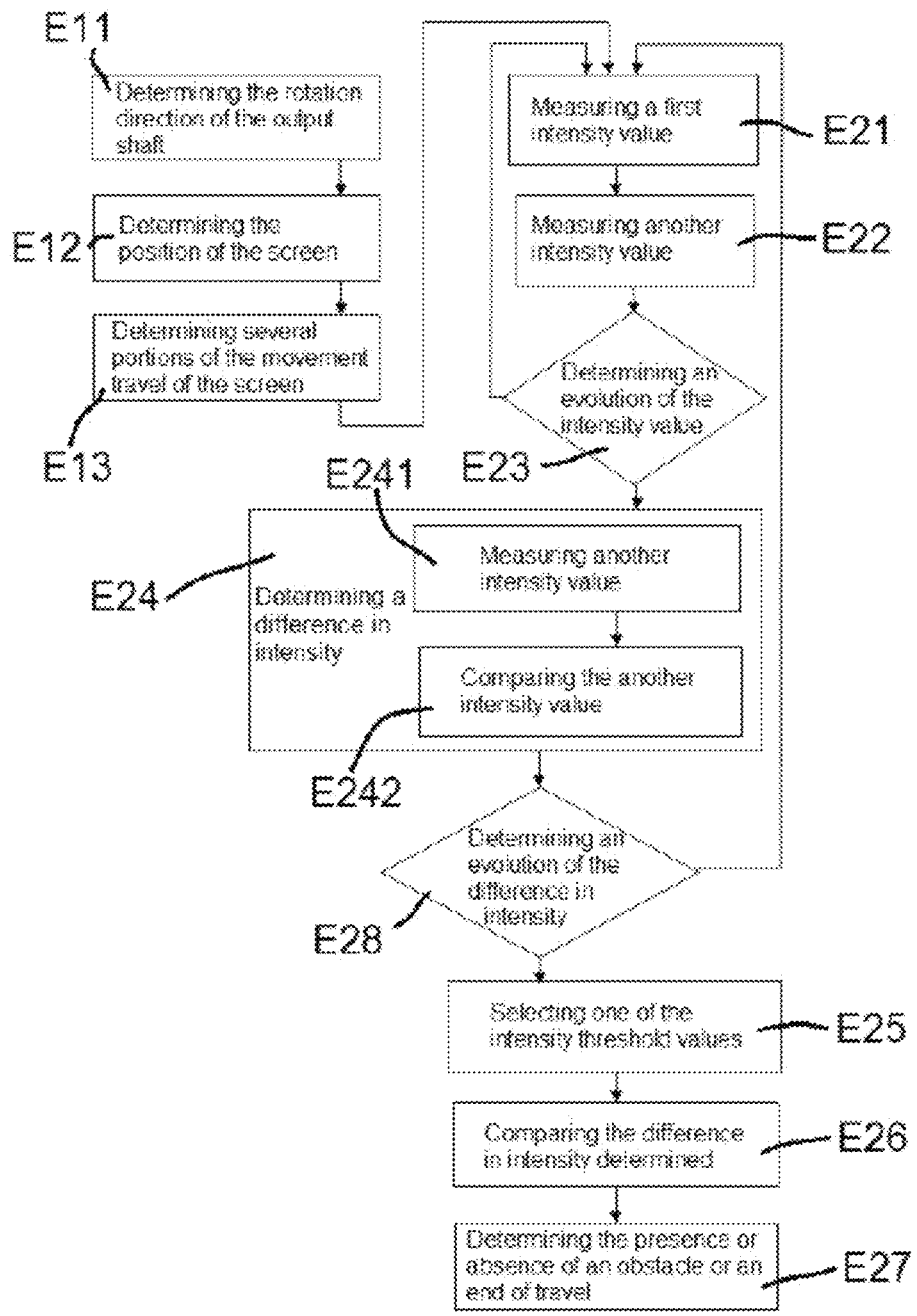
FIG. 5 is a block diagram of an algorithm of a control method of a motorized driving device of the home automation installation, as illustrated in FIGS. 1 to 4, according to one embodiment of the invention.
Figure 6:
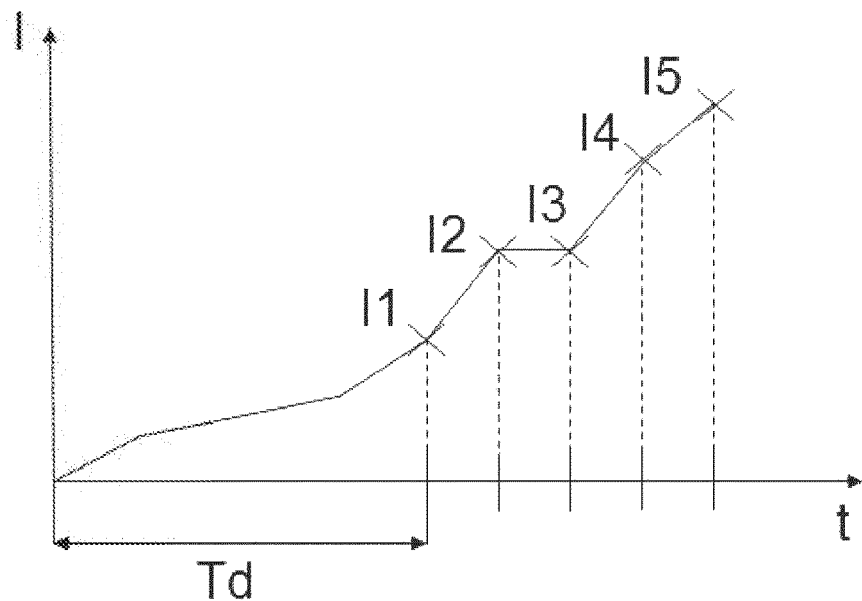
FIG. 6 is a graph showing the sampling of intensity values of an electric current passing through an electric motor during measuring steps when the control method, as shown in FIG. 5, is implemented.
Figure 7:
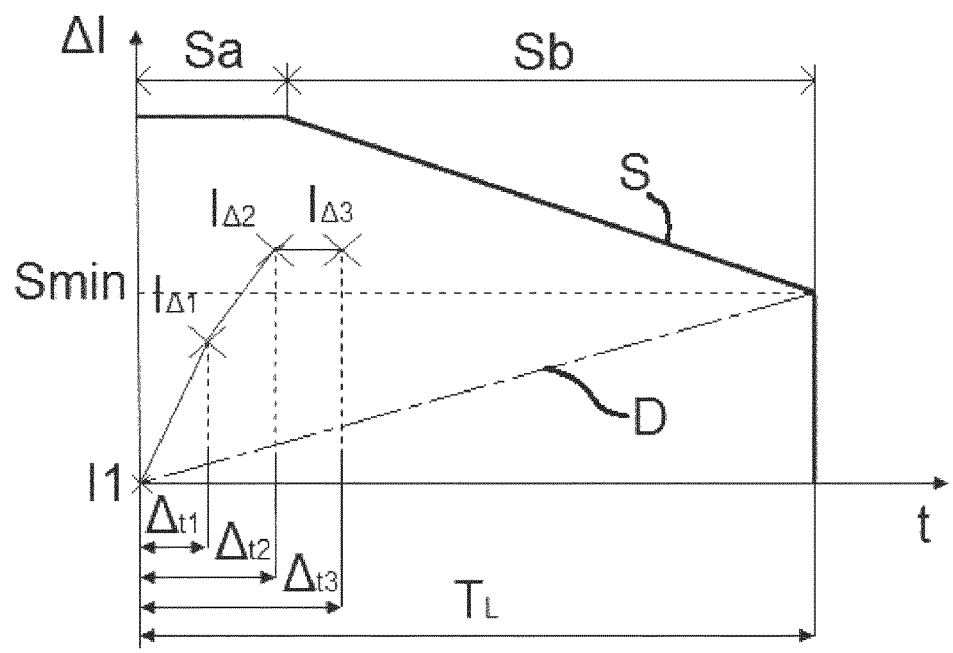
FIG. 7 is a graph showing the evolution of the threshold intensity values as a function of time when seeking to detect an obstacle or end of travel when the control method, as shown in FIG. 5, is carried out.

In reference to FIGS. 5 to 7, we will now describe an operating control method of the motorized driving device 5 of the home automation installation according to the invention illustrated in FIGS. 1 to 4.

In FIG. 6, the graph shows, by a curve using a solid line, the evolution of the intensity value I passing through the electric motor 16, as a function of time t.

The time t is shown on the x-axis, the intensity value I is shown on the y-axis.

In FIG. 7, the graph shows, by a curve using a thick solid line, the evolution of the intensity threshold values S as a function of time t and, by another curve using a thin solid line, the evolution of the difference in intensity ΔI relative to a first measured intensity value I1.

The time t is shown on the x-axis, the intensity threshold values S and the difference in intensity ΔI are shown on the y-axis.

The control method comprises a step E21 for measuring a first intensity value I1 of the electric current passing through the electric motor 16 via the measuring device 28, as illustrated in FIG. 6.

Preferably, the step E21 for measuring the first intensity value I1 is carried out after a predetermined period of time Td has elapsed beginning from the moment when the startup of the electric motor 16 is commanded. In this way, the step E21 for measuring the first intensity value I1 passing through the electric motor 16 is carried out after the transitional startup period of the electric motor 16 during which fluctuations of the intensity value I may be generated. Thus, the first measured intensity value I1, during the measuring step E21, is reliable to begin determining the presence or absence of an obstacle or an end of travel during the winding of the screen 2 or during the unwinding of the screen 2.

As a non-limiting example, the predetermined period of time Td, beginning from the moment when the startup of the electric motor 16 is commanded, is about 300 milliseconds.

In one embodiment, the startup command of the electric motor 16 corresponds to the switching of the control switches 24 of the electric motor 16.

Then, the control method comprises one or several additional steps E22 for measuring another intensity value I2, I3, I4, I5 passing through the electric motor 16 via the measuring device 28, following the implementation of the measuring step E21, as illustrated in FIG. 6.

Here and non-limitingly, the control method comprises four additional steps E22 for measuring four other intensity values I2, I3, I4, I5 passing through the electric motor 16 via the measuring device 28, following the implementation of the measuring step E21.

Advantageously, the additional steps E22 for measuring another intensity value I2, I3, I4, I5 are carried out periodically following the implementation of the measuring step E21. As a non-limiting example, the additional measuring steps E22 are successively carried out with a frequency of about 5 milliseconds.

Preferably, the number of additional measuring steps E22 for another intensity value I2, I3, I4, I5 by the measuring device 28 depends on the rotation speed of the output shaft 20 of the electromechanical actuator 11.

Thus, the adaptation of the number of additional measuring steps E22 based on the rotation speed of the output shaft 20 of the electromechanical actuator 11 makes it possible to acquire intensity values I1, I2, I3, I4, I5 according to the same periodicity.

As a non-limiting example, there are four additional measuring steps E22 for a rotation speed of 17 revolutions per minute of the output shaft 20 of the electromechanical actuator 11, and nine for a rotation speed of 8 revolutions per minute of the output shaft 20 of the electromechanical actuator 11.

Practically, the number of additional measuring steps E22 for another intensity value I2, I3, I4, I5 follows a linear law as a function of the rotation speed of the output shaft 20 of the electromechanical actuator 11.

The control method next comprises a step E23 for determining an evolution of the intensity value I passing through the electric motor 16 through steps E21, E22 for measuring intensity values I1, I2, I3, I4, I5.

Here, the determination step E23 is carried out using the electronic control unit 15, and in particular the microcontroller 27 of the electronic control unit 15.

The control method also comprises a step E24 for determining a difference in intensity ΔI relative to the first measured intensity value I1, after a period of time Δt has elapsed beginning from the first measured intensity value I1, as illustrated in FIG. 7.

The period of time Δt extends between the moment at which the first intensity value I1 is measured and the moment at which the difference in intensity ΔI is determined relative to the first measured intensity value I1.

In one embodiment, the period of time Δt corresponds to a movement travel length of the screen 2, or in other words a position reached by the end slat 8 of the screen 2.

The movement travel length of the screen 2 can in particular be determined based on the rotation angle of the winding tube 4, and in particular by one or several sensors of the electric motor 16 making it possible to determine the rotation angle of the rotor.

Here, the determination step E24 is carried out using the electronic control unit 15, and in particular the measuring device 22 and the microcontroller 27 of the electronic control unit 15.

Advantageously, the control method implements the step E24 for determining a difference in intensity ΔI relative to the first measured intensity value I1, when an increase in the intensity value I passing through the electric motor 16 is determined, during the determination step E23.

Thus, the control method only implements the determination step E24 if an increase of the intensity value I is determined based on the measuring steps E21, E22.

In this way, the first measured intensity value I1 corresponds to a reference intensity value when an increase in the intensity value I passing through the electric motor 16 is determined.

Furthermore, the determination of an increase in the intensity value I passing through the electric motor 16 makes it possible to trigger monitoring of the presence or absence of an obstacle or an end of travel by the detection device 27, from the moment when the first intensity value I1 is measured.

Furthermore, the step E24 for determining a difference in the intensity ΔI, relative to the first measured intensity value I1, is carried out only after an increase in the intensity value I passing through the electric motor 16 is determined, so as to limit the number of calculations done by the electronic control unit 15, and in particular by the microcontroller 27, to minimize the occupation rate of the resources thereof.

Adapting the number of additional measuring steps E22 for another intensity value I2, I3, I4, I5 by the measuring device 28 as a function of the rotation speed of the output shaft 20 of the electromechanical actuator 11 makes it possible, furthermore, to take the first measured intensity value I1 into account, irrespective of the rotation speed of the output shaft 20 of the electromechanical actuator 11.

In one embodiment, the determination of the increase of the intensity value passing through the electric motor 16 is done by a sub-step for comparing the measured intensity values I1, I2, I3, I4, I5 and, in particular, by successive iterations of the last measured intensity value relative to the intensity value previously measured.

Here, during the determination step E23, the first intensity value I1 measured during the measuring step E21 is compared to the first other intensity value I2 measured during the first additional measuring step E22 to determine whether the first measured intensity value I1 is lower than the first other measured intensity value I2.

Then, the first other intensity value I2 measured during the first additional measuring step E22 is compared to the second other intensity value I3 measured during the second additional measuring step E22 to determine whether the first other measured intensity value I2 is lower than the second other measured intensity value I3.

Then, the step E23 for determining an evolution of the intensity value I carries out similar comparisons for the other measured intensity values I4, I5.

Furthermore, in the case where it is determined that the intensity value passing through the electric motor 16 has decreased, during the determination step E23, the control method once again carries out the step E21 for measuring the first intensity value I1.

Thus, the step E21 for measuring the first intensity value I1 is restarted if it is determined that the intensity value I passing through the electric motor 16 has decreased, during the determination step E23.

In one embodiment, following the step E24 for determining a difference in intensity $\Delta I$ relative to the first measured intensity value I1, the control method comprises a step E28 for determining an evolution of the difference in intensity $\Delta I$.

Here, the determination step E28 is carried out using the electronic control unit 15, and in particular the measuring device 22 and the microcontroller 27 of the electronic control unit 15.

Preferably, the step E24 for determining a difference in intensity $\Delta I$ relative to the first measured intensity value I1 is implemented periodically, as long as the result of the step E28 for determining an evolution of the difference in intensity determines an increase in the intensity value I passing through the electric motor 16.

As a non-limiting example, the step E24 for determining a difference in intensity $\Delta I$ relative to the first measured intensity value I1 is carried out every 5 milliseconds, following the moment at which the first intensity value I1 is measured.

Advantageously, the step E24 for determining a difference in intensity $\Delta I$ is implemented from a sub-step E241 for measuring another intensity value $I_{A1}$, $I_{A2}$, $I_{A3}$ passing through the electric motor 16 by the measuring device 28, after a period of time $\Delta t1$, $\Delta t2$, $\Delta t3$ has elapsed beginning from the moment at which the first intensity value I1 is measured, then, in a sub-step E242 for comparing the other measured intensity value $I_{A1}$, $I_{A2}$, $I_{A3}$ relative to the first measured intensity value I1.

Here, the intensity value $I_{A1}$ corresponds to the difference between the first measured intensity value I1 and the second measured intensity value I2. The intensity value $I_{A2}$ corresponds to the difference between the first measured intensity value I1 and the third measured intensity value I3. Then, the intensity values $I_{An}$ are obtained through similar comparisons relative to the first measured intensity value I1.

In one embodiment, the sub-step E241 for measuring the other intensity value $I_{A1}$, $I_{A2}$, $I_{A3}$ passing through the electric motor 16, making it possible to determine a difference in the intensity $\Delta I$ relative to the first measured intensity value I1, is implemented according to the implementation frequency of the step E24 for determining a difference in intensity $\Delta I$ relative to the first intensity value I1.

Preferably, the step E24 for determining a difference in intensity $\Delta I$ relative to the first measured intensity value I1 is carried out periodically during a predetermined period of time $T_L$ beginning from the moment at which the first intensity value I1 is measured.

Thus, if the predetermined period of time $T_L$ has elapsed without the determination step E24 detecting a difference in intensity $\Delta I$ exceeding a predetermined intensity threshold value S, this means that the control method has arrived at an absence of determination of an obstacle or an end of travel during the predetermined period of time $T_L$.

Furthermore, in the case where the predetermined period of time $T_L$ has elapsed without the determination step E24 detecting a difference in intensity $\Delta I$ exceeding a predetermined intensity threshold value S, the control method once again carries out the step E21 for measuring the first intensity value I1 passing through the electric motor 16.

In one embodiment, the step E24 for determining a difference in intensity $\Delta I$ relative to the first measured intensity value I1 is carried out periodically during the predetermined period of time $T_L$ beginning from the moment at which the first intensity value I1 is measured, when an increase in the intensity value I passing through the electric motor 16 is determined, during the determination step E23.

Then, the control method comprises a step E25 for selecting one of the intensity threshold values S based on the elapsed period of time $\Delta t$.

Here, the selection step E25 is carried out using the electronic control unit 15, and in particular the microcontroller 27 of the electronic control unit 15.

Advantageously, the moment at which the first intensity value I1 is measured, from which the step E24 for determining a difference in intensity $\Delta I$ is carried out, corresponds to a startup moment of a search to detect an obstacle or end of travel based on a predefined detection sensitivity.

The predefined detection sensitivity can be selected, in particular, based on the position of the screen 2, or based on an entry done by the user through the local control unit 12 or the central control unit 13.

Advantageously, the intensity threshold values S stored in the memory of the electronic control unit 15 and used during the selection step E25 are set and follow a predetermined profile between a starting moment, the starting moment corresponding to the moment at which the first intensity value I1 is measured, and an end moment, the end moment corresponding to the end moment of the lapse of the predetermined period of time $T_L$ beginning from the moment at which the first intensity value I1 is measured.

Preferably, the profile of intensity threshold values S stored in a memory of the electronic control unit 15 and used during the selection step E25 comprises at least a first phase in which the intensity threshold values S are identical during a first predetermined period of time Sa from the moment at which the first intensity value I1 is measured, and a second phase where the intensity threshold values S are decreasing during a second predetermined period of time Sb following the first predetermined period of time Sa.

Here and non-limitingly, the first predetermined period of time Sa is about 100 milliseconds, and the second predetermined period of time Sb is about 200 milliseconds.

The intensity threshold values S of the first phase of the profile of intensity threshold values S stored in the memory of the electronic control unit 15 and used during the selection step E25 are identical so as to allow the detection of an end of travel or a rigid obstacle, for example a hard spot in the lateral guideways 6 during the passage of the slats of the screen 2 therein, or jamming of the slats of the screen 2 relative to one another, or a jolt during the winding of the articulation(s) 10 and the upper end slat of the screen 2 around the winding tube 4.

The intensity threshold values S of the second phase of the profile of intensity threshold values S stored in the memory of the electronic control unit 15 and used during the selection step E25 are decreasing so as to allow the detection of a flexible obstacle, for example the retention of slats of the screen 2 in the lateral guideways 6 by gel.

The intensity threshold values S of the second phase of the profile decrease until reaching a minimum threshold value Smin.

The minimum threshold value Smin corresponds to an intensity threshold value S greater than the torque variation caused by the unstacking of the slats of the screen 2 during the winding of the screen 2 from the lower end of travel.

The slope of a straight line D connecting the point representative of the first intensity value I1 to the point representative of the minimum intensity threshold value Smin, in FIG. 7, corresponds to the minimum slope of the difference in the intensity ΔI that can be used to determine an obstacle via the detection device 27.

Advantageously, the control method implements the step E25 for selecting one of the intensity threshold values S when an increase in the difference in the intensity ΔI is determined, during the step E28 for determining an evolution of the difference in the intensity ΔI relative to the first measured intensity value I1.

Thus, the control method only implements the selection step E25 if an increase in the difference in intensity ΔI is determined based on the step E21 for measuring the first intensity value I1 passing through the electric motor 16 and at least one sub-step E241 for measuring another intensity value $I_{A1}$, $I_{A2}$, $I_{A3}$ passing through the electric motor 16 implemented during the step E24 for determining a difference in the intensity ΔI.

Furthermore, the step E25 for selecting one of the intensity threshold values S is carried out only after an increase in the difference in intensity ΔI is determined, so as to limit the number of calculations done by the electronic control unit 15, and in particular of the microcontroller 27, to minimize the occupation rate of the resources thereof.

In one embodiment, the determination of the increase of the difference in intensity ΔI is done by a sub-step E242 for comparing the measured intensity values I1, $I_{A1}$, $I_{A2}$, $I_{A3}$ and, in particular, by successive iterations of the last measured intensity value relative to the intensity value previously measured.

Here, during the step E28 for determining an evolution of the difference in the intensity ΔI, the comparison of the first intensity value I1 measured during the measuring step E21 to the first other intensity value $I_{A1}$ measured during the measuring sub-step E241 is analyzed to determine whether the first measured intensity value I1 is lower than the first other measured intensity value $I_{A1}$.

Then, the comparison of the first other intensity value $I_{A1}$ measured during the first measuring sub-step E241 to a second other intensity value $I_{A2}$ measured during a second measuring sub-step E241 is analyzed to determine whether the first other measured intensity value $I_{A1}$ is lower than the second other measured intensity value $I_{A2}$.

Then, the step E28 for determining an evolution of the difference in the intensity ΔI analyzes similar comparisons for other measured intensity values $I_{An}$ as long as an increase in the difference in intensity ΔI is determined and the predetermined period of time $T_L$ has not elapsed.

Furthermore, in the case where it is determined that the difference in intensity ΔI has decreased, during the step E28 for determining an evolution of the difference in intensity ΔI, the control method once again carries out the step E21 for measuring the first intensity value I1 passing through the electric motor 16.

Thus, the step E21 for measuring the first intensity value I1 passing through the electric motor 16 is restarted if it is determined that the difference in the intensity ΔI has decreased, during the step E28 for determining an evolution of the difference in intensity ΔI.

The control method next comprises a step E26 for comparing the difference in intensity ΔI determined relative to the selected intensity threshold value S, and a step E27 for determining the presence or absence of an obstacle or an end of travel based on the result of the comparison step E26.

Here, the comparison step E26 and the determination step E27 are carried out using the electronic control unit 15, and in particular the microcontroller 27 of the electronic control unit 15.

The presence of an obstacle or an end of travel is determined when the determined difference in intensity ΔI is greater than or equal to the selected intensity threshold value S.

And the absence of an obstacle or an end of travel is determined when the determined difference in intensity ΔI is less than the selected intensity threshold value S.

Monitoring the torque generated by the electric motor 16 of the electromechanical actuator 11 through the measurement of the intensity I passing through the electric motor 16 by the measuring device 28 makes it possible to guarantee the reliability of determination of the absence or presence of an obstacle or an end of travel.

Using the measurement of the intensity I passing through the electric motor 16 makes it possible to guarantee the reactivity of determination of the absence or presence of an obstacle or an end of travel and to eliminate measuring uncertainties related to a measuring chain including one or several sensors.

Using the measurement of the intensity I passing through the electric motor 16 to perform the intensity measurements I1, I2, I3, I4, I5, $I_{A1}$, $I_{A2}$, $I_{A3}$ makes it possible to guarantee a sampling frequency based on the desired precision of the determination of the absence or presence of an obstacle or an end of travel. This sampling frequency of the intensity I passing through the electric motor 16 is thus independent of the voltage of the power supply grid of the sector, and in particular its frequency.

Preferably, the step E24 for determining a difference in intensity ΔI relative to the first measured intensity value I1 is implemented periodically, as long as the result of the step E27 for determining the presence or absence of an obstacle or an end of travel is different from a detected obstacle or detected end of travel.

Advantageously, the control method also comprises a step E11 for determining the rotation direction of the output shaft 20 of the electric motor 16, a step E12 for determining the position of the screen 2 of the concealing device 3 and a step E13 for determining several portions of the movement travel of the screen 2, during the winding of the screen 2 and during the unwinding of the screen 2.

In a first embodiment, at least the steps E24 for determining a difference in intensity ΔI, selecting E25 one of the intensity threshold values S, comparing E26 the determined difference in intensity ΔI to the selected intensity threshold value S and determining E27 the presence or absence of an obstacle or an end of travel are carried out during at least one portion of the movement travel of the screen 2, during the winding of the screen 2 or during the unwinding of the screen 2.

In such a case, these steps E24, E25, E26, E27 making it possible to determine the presence or absence of an obstacle or an end of travel are carried out during a portion of the movement travel of the screen 2, following the implementation of steps E11, E12, E13 making it possible to determine the position of the screen 2 during a movement thereof caused by the electromechanical actuator 11.

This first embodiment is preferably implemented following the determination of the upper and lower end of travel stops making it possible to delimit the movement travel of the screen 2 of the concealing device 3.

The determination of the upper and lower end of travel stops can be done either automatically or manually. The automatic determination of the upper and lower end of travel stops is implemented, during commissioning of the home automation installation, by a sequence of movements of the screen 2 until an obstacle is detected in the upper part of the home automation installation, then until an obstacle is detected in the lower part of the home automation installation. The manual determination of the upper and lower end of travel stops is implemented, during commissioning of the home automation installation, by a movement of the screen 2 to an upper position defined by the user by pressing, for example, on a button of the remote control 14, and even to a lower position.

Advantageously, at least the steps E24 for determining a difference in intensity ΔI, selecting E25 one of the intensity threshold values S, comparing E26 the determined difference in intensity ΔI to the selected intensity threshold value S and determining E27 the presence or absence of an obstacle or an end of travel are carried out during a startup portion of the movement travel of the screen 2, during the winding of the screen 2 or during its unwinding, after reaching an end of travel.

In such a case, during one or several other portions of the movement travel of the screen 2, the intensity threshold value S is fixed.

Thus, during the other portion(s) of the movement travel of the screen 2, the intensity threshold value S is independent of the period of time Δt elapsed from the first measured intensity value I1.

Preferably, the fixed intensity threshold value S of the other portion(s) of the movement travel of the screen 2 is less than or equal to the smallest of the intensity threshold values S used during the startup portion of the movement travel of the screen 2.

Thus, the determination of the presence or absence of an obstacle or an end of travel by the detection device 27 is done with a relatively high sensitivity threshold during the other portion(s) of the movement travel of the screen 2.

Advantageously, the other portion(s) of the movement travel of the screen 2 in particular correspond to the docking zones on the upper and lower ends of travel.

Furthermore, the determination of the presence or absence of an obstacle or an end of travel by the detection device 27 is done with a low sensitivity threshold during the startup portion of the movement travel of the screen 2, so as to avoid untimely triggering of the detection device 27 causing the motorized driving device 5 to stop.

In a second embodiment, at least the steps E24 for determining a difference in intensity ΔI, selecting E25 one of the intensity threshold values S, comparing E26 the determined difference in intensity ΔI to the selected intensity threshold value S and determining E27 the presence or absence of an obstacle or an end of travel are carried out all along the movement travel of the screen 2, during the winding of the screen 2 or during its unwinding.

In such a case, these steps E24, E25, E26, E27 making it possible to determine the presence or absence of an obstacle or an end of travel are carried out over the entire length of the movement travel of the screen 2.

This second embodiment is preferably implemented during the installation of the concealing device 3, and in particular before the determination of the upper and lower end of travel stops making it possible to delimit the movement travel of the screen 2 of the concealing device 3.

Advantageously, the first measured intensity value I1, the other measured intensity value(s) $I_{A1}$, $I_{A2}$, $I_{A3}$ allowing the determination of a difference in the intensity ΔI relative to the first measured intensity value I1 and the determination of an evolution of the difference in intensity ΔI relative to the first measured intensity value I1, as well as the other measured intensity value(s) I2, I3, I4, I5 allowing the determination of an evolution of the intensity value I passing through the electric motor 16 are temporarily stored in a buffer memory of the electronic control unit 15, and in particular of the microcontroller 27.

Owing to the present invention, the control method makes it possible to determine whether ends of travel of movement of the screen have been reached, as well as whether obstacle is present or absent by monitoring differences in intensity relative to a first intensity value passing through the electric motor.

In this way, the control method makes it possible to determine the presence or absence of an obstacle or an end of travel dynamically, by comparing differences in intensity determined from a first intensity value passing through the electric motor relative to an intensity threshold value selected based on the period of time elapsed between the moment at which the first intensity value is measured and the moment at which an intensity difference is determined.

Consequently, the control method makes it possible to guarantee the protection of the motorized driving device and the home automation installation, while limiting untimely movement stops of the screen of the concealing device.

The present invention also relates to a computer program product comprising code instructions arranged to carry out the steps of the control method according to the invention, as previously described.

Furthermore, the electronic control unit comprises the microcontroller. The microcontroller includes the code instructions for the computer program product in memory. Additionally, the electronic control unit is configured at least to determine a difference in intensity, select one of the intensity threshold values, compare the determined difference in intensity to the selected intensity threshold value and determine the presence or absence of an obstacle or end of travel.

Many changes can be made to the example embodiment previously described without going beyond the scope of the invention defined by the claims.

In particular, the electric motor of the electromechanical actuator may be of the three-phase type or the direct current type. Furthermore, the considered embodiments and alternatives may be combined to generate new embodiments of the invention.

The invention claimed is:

1. An operating control method of a motorized driving device of a closure or sun protection home automation installation, the closure or sun protection home automation installation including a concealing device including at least a screen, and a winding tube, the motorized driving device including at least an electromechanical actuator configured to enable winding and unwinding the screen on the winding tube, between a wound position and an unwound position, the electromechanical actuator including at least an electric motor, an output shaft connected to the winding tube of the concealing device, and an electronic control unit comprising at least a device for measuring an intensity value of an electric current passing through the electric motor, a memory storing a plurality of intensity threshold values, and a device for detecting obstacles and ends of travel during winding of the screen and during unwinding of the screen, said method comprising:
   a first measure step for measuring a first intensity value of the electric current passing through the electric motor via the measuring device;
   a first determination step for determining a difference in intensity relative to the first measured intensity value, after a period of time has elapsed beginning from the moment at which the first intensity value is measured;
   a selection step for selecting one of the intensity threshold values depending on the elapsed period of time, among a set of intensity threshold values stored in the memory;
   a comparison step for comparing the determined difference in intensity to the selected intensity threshold value; and
   a second determination step for determining the presence or absence of an obstacle or an end of travel by the detection device based on the result of the comparison step.

2. The operating control method of a motorized driving device of a closure or sun protection home automation installation according to claim 1, the method further comprising:
   one or more additional measure steps for measuring another intensity value passing through the electric motor via the measuring device, following the implementation of the first measure step for measuring the first intensity value passing through the electric motor, and
   a third determination step for determining an evolution of the intensity value passing through the electric motor through the measure steps for measuring an intensity value passing through the electric motor,
   wherein said method implements the first determination step for determining a difference in intensity relative to the first measured intensity value only when the third determination step for determining an evolution of the intensity value passing through the electric motor determines an increase in the intensity value passing through the electric motor.

3. The operating control method of a motorized driving device of a closure or sun protection home automation installation according to claim 2, wherein, in the case where, during the third determination step for determining an evolution of the intensity value passing through the electric motor, it is determined that the intensity value passing through the electric motor has decreased, the control method once again carries out the first measure step for measuring the first intensity value passing through the electric motor.

4. The operating control method of a motorized driving device of a closure or sun protection home automation installation according to claim 1, wherein, following the first determination step for determining a difference in intensity relative to the first measured intensity value, the control method comprises a fourth determination step for determining an evolution of the difference in intensity relative to the first measured intensity value.

5. The operating control method of a motorized driving device of a closure or sun protection home automation installation according to claim 4, wherein the first determination step for determining a difference in intensity relative to the first measured intensity value is implemented periodically, as long as the result of the fourth determination step for determining an evolution of the difference in intensity corresponds to an increase in the intensity value passing through the electric motor.

6. The operating control method of a motorized driving device of a closure or sun protection home automation installation according to claim 1, wherein the first determination step for determining a difference in intensity relative to the first measured intensity value is implemented periodically, as long as the result of the second determination step for determining the presence or absence of an obstacle or an end of travel is different from a detected obstacle or detected end of travel.

7. The operating control method of a motorized driving device of a closure or sun protection home automation installation according to claim 1, wherein the first determination step for determining a difference in intensity relative to the first measured intensity value is carried out periodically during a predetermined period of time beginning from the moment at which the first intensity value is measured.

8. The operating control method of a motorized driving device of a closure or sun protection home automation installation according to claim 1, wherein the first measure step for measuring the first intensity value passing through the electric motor is carried out after a predetermined period of time has elapsed beginning from the moment when the startup of the electric motor is commanded.

9. The operating control method of a motorized driving device of a closure or sun protection home automation installation according to claim 1, the method further comprising:
   a fifth determination step for determining the rotation direction of the output shaft of the electric motor,
   a sixth determination step for determining the position of the screen of the concealing device, and
   a seventh determination step for determining several portions of the movement travel of the screen during the winding of the screen and during the unwinding of the screen,
   wherein at least the first determination step for determining a difference in intensity, the selection step for selecting one of the intensity threshold values, the comparison step for comparing the determined difference in intensity to the selected intensity threshold value and the second determination step for determining the presence or absence of an obstacle or an end of travel are carried out during at least one portion of the movement travel of the screen, during the winding of the screen or during the unwinding of the screen.

10. The operating control method of a motorized driving device of a closure or sun protection home automation installation according to claim 9, wherein at least said first determination step for determining a difference in intensity, the selection step for selecting one of the intensity threshold values, the comparison step for comparing the determined difference in intensity to the selected intensity threshold value and the second determination step for determining the presence or absence of an obstacle or an end of travel are carried out during a startup portion of the movement travel of the screen, during the winding of the screen or during the unwinding of the screen, after reaching an end of travel.

11. A motorized driving device of a closure or sun protection home automation installation, the motorized driving device comprising:
an electromechanical actuator configured to enable winding and unwinding a screen on a winding tube of a concealing device of the closure or sun protection home automation installation, between a wound position and an unwound position, the electromechanical actuator comprising at least:
an electric motor,
an output shaft connected to the winding tube of the concealing device, and
an electronic control unit comprising at least:
a device for measuring configured to measure a first intensity value of an electric current passing through the electric motor,
a memory storing a plurality of intensity threshold values, and
a device for detecting obstacles and ends of travel during winding of the screen and during unwinding of the screen,
the electronic control unit being configured to determine a difference in intensity relative to the first measured intensity value, after a period of time has elapsed beginning from the moment at which the first intensity value is measured, select one of the plurality of intensity threshold values depending on the elapsed period of time, among a set of intensity threshold values stored in the memory, compare the determined difference in intensity to the selected intensity threshold value, and determine the presence or absence of an obstacle or an end of travel by a detection device based on the result of the comparison.

12. The motorized driving device of a closure or sun protection home automation installation according to claim 11, wherein said motorized driving device includes an electromechanical actuator having a brushless electric motor with electronic switching.

* * * * *